United States Patent [19]

Bush

[11] Patent Number: 4,988,943
[45] Date of Patent: Jan. 29, 1991

[54] VSWR METER ARRANGEMENT WITH A DISPLAY OUTPUT HAVING A LINEAR SCALE

[75] Inventor: Harry D. Bush, Palatine, Ill.
[73] Assignee: Motorola, Inc., Schaumburg, Ill.
[21] Appl. No.: 398,693
[22] Filed: Aug. 25, 1989
[51] Int. Cl.$^5$ ............................................. G01R 7/04
[52] U.S. Cl. ................................. 324/140 D; 324/646; 455/115
[58] Field of Search .................... 324/646, 98, 123 R, 324/140 D, 140 R, 645, 642, 647; 455/67, 115

[56] References Cited

U.S. PATENT DOCUMENTS

| | | | |
|---|---|---|---|
| 3,870,957 | 3/1975 | Straw | 455/115 X |
| 4,041,395 | 8/1977 | Hill | 324/140 D X |
| 4,110,685 | 8/1978 | Leenerts | 324/646 |
| 4,262,246 | 4/1981 | Fujii | 324/646 |
| 4,479,087 | 10/1984 | Althouse | 324/646 |

Primary Examiner—Reinhard J. Eisenzopf
Assistant Examiner—Jack B. Harvey
Attorney, Agent, or Firm—Wayne J. Egan

[57] ABSTRACT

A VSWR meter arrangement with a linear scale. The VSWR display is made linear by inputting the $V_{forward}$ and $V_{reverse}$ signals to a first op amp-based circuit to provide a first output $= K(V_f - V_r)$. The signals are also input to a second op amp-based circuit to provide a second output $= V_f + V_r$. The first output is then coupled to the $V_{reference}$ input of a conventional voltmeter. The second output is then coupled to the $V_{signal}$ input of the voltmeter. The voltmeter's display output will then indicate the VSWR as a linear percentage of scale.

6 Claims, 1 Drawing Sheet

VSWR METER ARRANGEMENT WITH A DISPLAY OUTPUT HAVING A LINEAR SCALE

TECHNICAL FIELD

This invention relates to a voltage standing wave ratio (VSWR) meter.

BACKGROUND OF THE INVENTION

Transmission line measurements have been made for many years. The calculation of VSWR was first made by the simple ratio of maximum voltage, as determined by slotted line probes or sliding voltmeter, to the minimum voltage along a transmission line. Later, calibrated directional couplers permitted measurement through non-linear scale meters and an adjustable control to set the forward voltage to full scale. Several popular electronics manufacturers popularlized this system.

The scale calibration can be generated from:

$$\% \text{ Scale} = \frac{1 - 1/VSWR}{1 + 1/VSWR} = \frac{VSWR - 1}{VSWR + 1} = \frac{V_{reverse}}{V_{forward}}$$

The development of Analog to Digital (A/D) converters for LED and LCD displays such as the National Semiconductor LM3914 gave rise to several no-knobs versions of the instrument with the forward voltage being used for the reference and the reverse voltage for the signal. While the calibration is automatic, the scale is still non-linear. Obviously, then, it would be desirable to provide an improved VSWR meter with a linear scale.

SUMMARY OF THE INVENTION

Accordingly, an improved VSWR meter arrangement is provided with a linear scale. The VSWR display is made linear by inputting the $V_{forward}$ and $V_{reverse}$ signals to a first op amp-based circuit to provide first output $= K(V_f - V_r)$. The signals are also input a second op amp-based circuit to provide a second output $= V_f + V_r$. The first output is then coupled to the $V_{reference}$ input of a conventional voltmeter, such as the Intersil ICL7106 or MAXIM MAX 131. The second output is then coupled to the $V_{signal}$ input of the voltmeter. The voltmeter's display output will then indicate the VSWR as a linear percentage of scale.

DETAILED DESCRIPTION OF THE INVENTION

Figure 1:
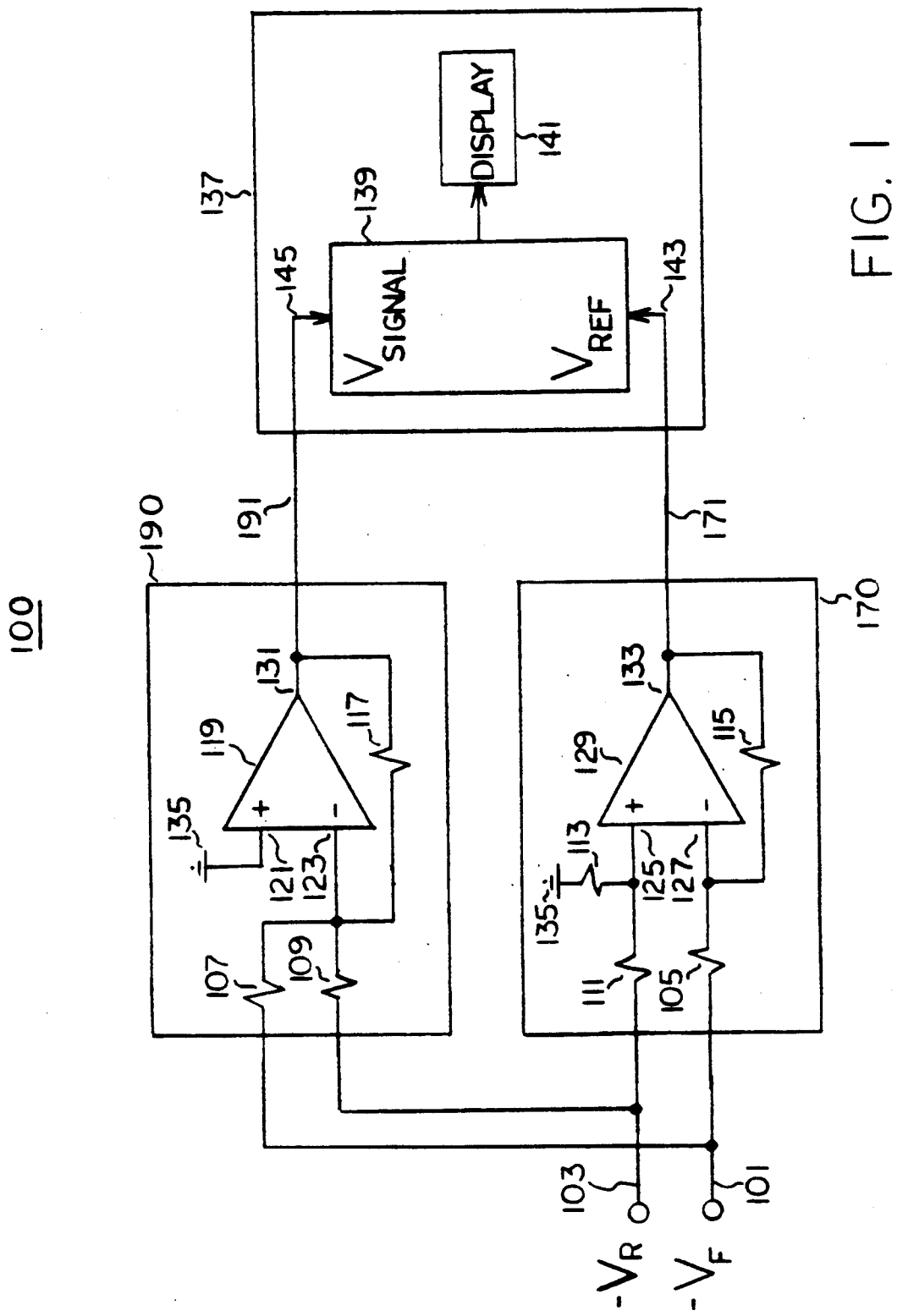
FIG. 1 is a block diagram of a first embodiment of a VSWR meter arrangement, according to the invention.

Referring now to FIG. 1, there is shown a block diagram of the first embodiment.

There is shown a first circuit 170, a second circuit 190, and a conventional voltmeter/display 137 comprising a voltmeter unit 138 and a display unit 141.

There is shown a first input signal 101 and a second input signal 103. As shown, the first input signal 101 is $-V_f$ and the second input signal 103 is $-V_r$. As shown, both input signals are coupled to the first circuit 170, which circuit provides a first output signal 171. The signal 171 is coupled to the $V_{reference}$ terminal 143 of the voltmeter 139.

As shown, both input signals are also coupled to the second circuit 190, which circuit provides a second output signal 191. The signal 191 is coupled to the $V_{signal}$ terminal 145 of the voltmeter 139.

The first circuit 170 comprises a first analog operational amplifier unit 129, and four (4) resistors 105, 111, 113, and 115. The second circuit 190 comprises a second analog operational amplifier unit 119, and three (3) resistors 107, 109, and 117.

As shown, the voltmeter/display 137 comprises a voltmeter 139 having an independent $V_{reference}$ terminal 143 coupled to a display unit 141. Such a voltmeter/display 137, for example, may be a hand-held battery-operated digital display meter with an external or "independent" reference voltage, as is commonly available from a typical "popular electronics" store.

As is shown, the input $-V_f$ 101 is input to the negative ($-$) input terminal 127 of the first op amp 129 via resister 105. Resistor 115 couples terminal 127 to the output 133. The input $-V_r$ 103 is input to positive ($+$) terminal 125 via resistor 111. Resistor 113 couples the input 125 to ground 135.

Also as shown, the input $-V_f$ 101 is input to the negative ($-$) input 123 of the second op amp 119 via resistor 107. Also, the input $-V_r$ 103 is input to input 123 via resistor 109. Resistor 117 couples input 123 to the op amp's output 131. The op amp 119's positive ($+$) terminal 121 is coupled to ground 135.

The op amp 129's output 133 is coupled to the $V_{reference}$ terminal 143 of the voltmeter 139 via the first output 171. The second op amp 119's output 131 is coupled to the $V_{signal}$ terminal 145 of the voltmeter 139 via the second output 191.

The values of the five resistors 105, 107, 109, 111, and 117 are equal to a first predetermined value, $X_1$. The values of the two resistors 113 and 115 are equal to a second predetermined value, $X_2$. The ratio of $X_2/X_1 =$ a constant, K, typically ranging from 10 to 100.

The first circuit 170 subtracts the forward and reverse signal voltages ($V_f$ and $V_r$) and multiplies them by K, whereas the second circuit 190 sums the two signal voltages ($V_f$ and $V_r$). As a result, the second output 191— which signal is impressed on the $V_{signal}$ input 145— is mathematically equal to $V_f + V_r$. Also, the first output 171— which signal is impressed on the $V_{reference}$ input 143— is mathematically equal to $K(V_f - V_r)$. If K is chosen to equal the full-scale VSWR of the display 141, then the scale factor for the voltmeter display 141 is now:

$$\% \text{ Scale} = V_{signal}/V_{reference} = V_f + V_r/K(V_f - V_r) = VSWR,$$

and the VSWR is a linear percentage of scale.

While various embodiments of the VSWR meter, according to the invention, have been disclosed herein, the scope of the invention is defined by the following claims.

What is claimed is:

1. An improved VSWR meter arrangement with a display output having a linear scale, comprising:
   a voltmeter/display unit (137) having a $V_{signal}$ input (145) and a $V_{reference}$ input (143) that may be controlled by the user;
   means for providing $-V_{forward}$ (101) and $-V_{reverse}$ (103) signals;
   means for coupling said $-V_{forward}$ and $-V_{reverse}$ signals to a first subtracting and multiplying circuit (170) to provide a first output (171) equal to $K(V_f-V_r)$ where K is a predetermined constant;

means for coupling said $-V_{forward}$ and $-V_{reverse}$ signals to a second adding circuit (190) to provide a second output (191) equal to $(V_f+V_r)$;

means for coupling said first output to said $V_{reference}$ input of said voltmeter/display unit;

means for coupling said second output to said $V_{signal}$ input of said voltmeter/display unit;

said first subtracting and multiplying circuit (170) comprising a first analog amplifier unit (129), said second adding circuit (190) comprising a second analog operational amplifier unit (119);

said voltmeter/display unit (137) comprising a voltmeter (139) coupled to a display unit (141), said display unit (141) indication the VSWR as a linear percentage of scale;

said voltmeter/display unit (137) being directly connected to said first analog amplifier unit (129) and said second analog operational amplifier unit (119).

2. An improved VSWR meter arrangement with a display output having a linear scale, comprising:

a voltmeter/display unit (137) having a $V_{signal}$ input (145) and a $V_{reference}$ input (143) that may be controlled by the user;

means for providing a first input signal (101) based on $V_{forward}$ and means for providing a second input signal (103) based on $V_{reverse}$;

means for coupling said first and second input signals to a first circuit (170) to provide a first output (171) equal to a predetermined constant times $(V_f-V_r)$;

means for coupling said first and second input signals to a second circuit (190) to provide a second output (191) equal to $(V_f+V_r)$;

means for coupling said first output to said $V_{reference}$ input (143) of said voltmeter/display unit;

said voltmeter/display unit (137) comprising a voltmeter (139) whose output is arranged to drive a display unit (141) so that said display unit (141) indicates the VSWR as linear percentage of scale;

said voltmeter (139) being directly connected to said first circuit (170) and said second circuit (190).

3. The arrangement of claim 2 wherein said first circuit (170) is arranged to subtract and multiply said first and second input signals.

4. The arrangement of claim 3 wherein said second circuit (190) is arranged to add said first and second input signals.

5. The arrangement of claim 4 wherein said first circuit (170) comprises a first operational amplifier unit (129).

6. The arrangement of claim 5 wherein said second circuit (190) comprises a second operational amplifier unit (119).

* * * * *

UNITED STATES PATENT AND TRADEMARK OFFICE
CERTIFICATE OF CORRECTION

PATENT NO. : 4,988,943

DATED : Jan. 29, 1991

INVENTOR(S) : Harry D. Bush

It is certified that error appears in the above-identified patent and that said Letters Patent is hereby corrected as shown below:

Column 4, line 11, insert after "unit;" --means for coupling said second output to said $V_{signal}$ imput (145) of said volmeter/display unit;--.

Signed and Sealed this

Fourth Day of August, 1992

Attest:

DOUGLAS B. COMER

*Attesting Officer*    Acting Commissioner of Patents and Trademarks